United States Patent
Tan

(10) Patent No.: US 9,653,355 B2
(45) Date of Patent: May 16, 2017

(54) FLIP CHIP PACKAGE STRUCTURE AND FABRICATION PROCESS THEREOF

(71) Applicant: Silergy Semiconductor Technology (Hangzhou) LTD, Hangzhou, ZheJiang Province (CN)

(72) Inventor: Xiaochun Tan, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 14/094,278

(22) Filed: Dec. 2, 2013

(65) Prior Publication Data
US 2014/0167256 A1  Jun. 19, 2014

(30) Foreign Application Priority Data
Dec. 17, 2012 (CN) .......................... 2012 1 0550325

(51) Int. Cl.
*H01L 23/48* (2006.01)
*H01L 21/768* (2006.01)
(Continued)

(52) U.S. Cl.
CPC .... *H01L 21/76885* (2013.01); *H01L 23/3192* (2013.01); *H01L 24/03* (2013.01); *H01L 24/05* (2013.01); *H01L 24/11* (2013.01); *H01L 24/13* (2013.01); *H01L 2224/0332* (2013.01); *H01L 2224/0345* (2013.01); *H01L 2224/0346* (2013.01); *H01L 2224/0348* (2013.01); *H01L 2224/0361* (2013.01); *H01L 2224/0391* (2013.01); *H01L 2224/03334* (2013.01); *H01L 2224/03452* (2013.01); *H01L 2224/03462* (2013.01); *H01L 2224/0401* (2013.01); *H01L 2224/05082* (2013.01); *H01L 2224/05083* (2013.01); *H01L 2224/05124* (2013.01); *H01L 2224/05155* (2013.01); *H01L 2224/05166* (2013.01); *H01L 2224/05639* (2013.01); *H01L 2224/05647* (2013.01); *H01L 2224/1147* (2013.01); *H01L 2224/11462* (2013.01);
(Continued)

(58) Field of Classification Search
CPC ..... H01L 23/3192; H01L 24/03; H01L 24/05; H01L 24/11; H01L 24/13; H01L 2924/1305; H01L 2224/0391; H01L 2224/05155; H01L 2224/81191; H01L 2224/13111; H01L 2224/05082
USPC .......................... 257/737–738, 780–781, 784
See application file for complete search history.

(56) References Cited

U.S. PATENT DOCUMENTS 8,283,758 B2  10/2012  Jiang
8,294,256 B2  10/2012  Chen et al.
(Continued)

FOREIGN PATENT DOCUMENTS

CN  1499589 A  5/2004

*Primary Examiner* — Hoa B Trinh
(74) *Attorney, Agent, or Firm* — Michael C. Stephens, Jr.

(57) ABSTRACT

Disclosed herein are various chip packaging structures and methods of fabrication. In one embodiment, a flip chip package structure can include: (i) a pad on a chip; (ii) an isolation layer on the chip and the pad, where the isolation layer includes a through hole that exposes a portion of an upper surface of the pad; (iii) a metal layer on the pad, where the metal layer fully covers the exposed upper surface portion of the pad; and (iv) a bump on the metal layer, where side edges of the bump do not make contact with the isolation layer.

16 Claims, 9 Drawing Sheets

(51) Int. Cl.
*H01L 23/00* (2006.01)
*H01L 23/31* (2006.01)

(52) U.S. Cl.
CPC .................. *H01L 2224/131* (2013.01); *H01L 2224/13007* (2013.01); *H01L 2224/13014* (2013.01); *H01L 2224/13017* (2013.01); *H01L 2224/13018* (2013.01); *H01L 2224/13111* (2013.01); *H01L 2224/13116* (2013.01); *H01L 2224/13118* (2013.01); *H01L 2224/13144* (2013.01); *H01L 2224/13147* (2013.01); *H01L 2224/16225* (2013.01); *H01L 2224/16245* (2013.01); *H01L 2224/81191* (2013.01); *H01L 2924/1305* (2013.01); *H01L 2924/13062* (2013.01); *H01L 2924/13091* (2013.01); *H01L 2924/351* (2013.01)

(56) References Cited

U.S. PATENT DOCUMENTS

| | | |
|---|---|---|
| 2007/0130759 A1 | 6/2007 | Harnden |
| 2013/0134567 A1 | 5/2013 | Tan |
| 2013/0134568 A1 | 5/2013 | Tan |
| 2013/0187268 A1* | 7/2013 | Lin .................. H01L 23/49866 257/737 |
| 2013/0249082 A1* | 9/2013 | Chien et al. .................. 257/737 |
| 2014/0110838 A1* | 4/2014 | Rogalli .................. H01L 24/05 257/738 |
| 2014/0117533 A1* | 5/2014 | Lei et al. ...................... 257/737 |

* cited by examiner

FLIP CHIP PACKAGE STRUCTURE AND FABRICATION PROCESS THEREOF

RELATED APPLICATIONS

This application claims the benefit of Chinese Patent Application No. 201210550325.8, filed on Dec. 17, 2012, which is incorporated herein by reference in its entirety.

FIELD OF THE INVENTION

The present invention relates to semiconductor packaging technology, and more particularly to a flip chip package structure and fabrication process.

BACKGROUND

Solder bumps can be used to connect and active surface of a semiconductor integrated circuit or "chip" to a substrate or a lead frame. The solder bumps can be used to achieve electrical mechanical connectivity between the chip and the substrate (or the lead frame). In flip chip packaging technology, the size, structure and conductivity of the bumps may greatly affect the overall package.

SUMMARY

In one embodiment, a flip chip package structure can include: (i) a pad on a chip; (ii) an isolation layer on the chip and the pad, where the isolation layer includes a through hole that exposes a portion of an upper surface of the pad; (iii) a metal layer on the pad, where the metal layer fully covers the exposed upper surface portion of the pad; and (iv) a bump on the metal layer, where side edges of the bump do not make contact with the isolation layer.

In one embodiment, a method of fabricating a flip chip package structure, can include: (i) forming a pad on a chip; (ii) depositing an isolation layer on the chip and the pad; (iii) forming a through hole in the isolation layer to selectively expose a portion of an upper surface of the pad; (iv) depositing a metal layer on the pad to fully cover the exposed portion of the pad; and (v) forming a bump on the metal layer, where side edges of the bump do not make contact with the isolation layer.

Embodiments of the present invention can provide several advantages over conventional approaches, as may become readily apparent from the detailed description of preferred embodiments below.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Microelectronic packages can include microelectronic circuits or components, thin-film recording heads, data storage elements, microfluidic devices, and/or other components manufactured on microelectronic substrates. Microelectronic substrates can include semiconductor pieces (e.g., doped silicon wafers, gallium arsenide wafers, etc.), non-conductive pieces (e.g., various ceramic substrates), or conductive pieces (e.g., metal or metal alloy). A semiconductor die or chip is used throughout to include a variety of articles of manufacture, including, e.g., individual integrated circuit dies, imager dies, sensor dies, and/or dies having other semiconductor features.

Figure 1:
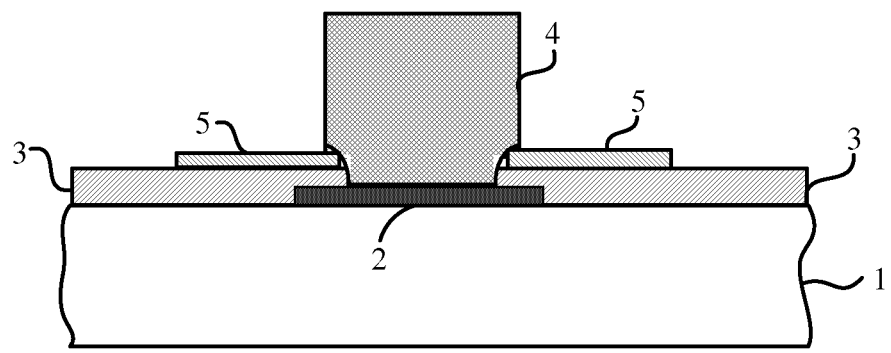
FIG. 1 shows a cross-section diagram of an example flip chip package structure.

FIG. 1 shows a diagram of an example flip chip package structure. In this example chip 1 can be covered by pad 2, and isolation layer 3 as shown. Isolation layer 3 may also have a through hole to expose a portion of the pad. Also, solder bump 4 can be deposited on an upper surface of the exposed pad. In this example, a width of the bottom of bump 4 may greater than the width of the pad. As a result, the side edges of bump 4 may make contact with isolation layer 3.

Therefore, during packaging, transportation, and/or reliability test, due to the influence of thermal and mechanical stresses, the surface of isolation layer 3 on the side edges of bump 4 may break, or otherwise be damaged. Protection layer 5 (e.g., nylon material) can be uitilized to cover a contacting portion of isolation layer 3 and bump 4, so as to prevent a surface of isolation layer 3 from being damaged. However, under relatively high pressure, protection layer 5 may not suitably protect the device, and one or more additional protection layers may be uitilized, resulting in increased product costs.

In one embodiment, a flip chip package structure can include: (i) a pad on a chip; (ii) an isolation layer on the chip and the pad, where the isolation layer includes a through hole that exposes a portion of an upper surface of the pad; (iii) a metal layer on the pad, where the metal layer fully covers the exposed upper surface portion of the pad; and (iv) a bump on the metal layer, where side edges of the bump do not make contact with the isolation layer.

Figure 2:
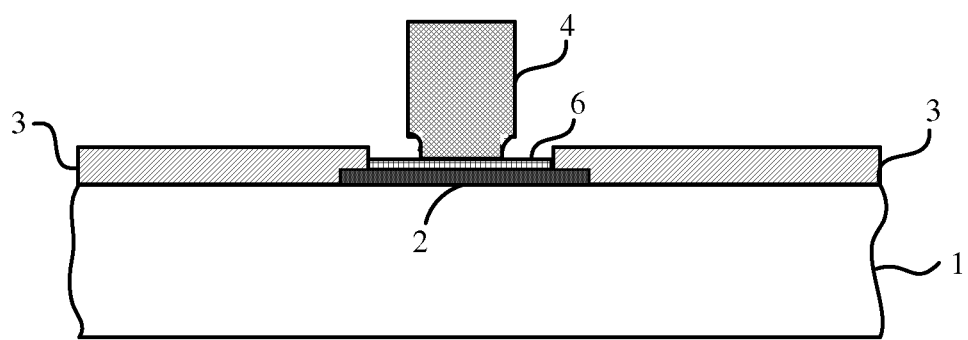
FIG. 2 shows a cross-section diagram of an example flip chip package structure in accordance with embodiments of the present invention.

Referring now to FIG. 2, shown is a cross-section diagram of an example flip chip package structure in accordance with embodiments of the present invention. In this example, pad 2 can be located above or on an active surface of chip 1. Isolation layer 3 can cover chip 1 and pad 2. Also, isolation layer 3 can have a through hole (e.g., contact hole) therein to selectively expose a portion of an upper surface of the pad. For example, the material of the pad can include aluminum, an aluminum alloy, or any other suitable conductive material.

Isolation layer 3 can be a passivation layer, and may be formed by, e.g., silicon nitride or silicon oxide, and can be used to protect the chip from corrosion and other damage. For example, a semiconductor passivation technique can utilize a plasma enhanced chemical vapor deposition (PECVD) process to produce a silicon-rich nitride film as a passivation layer. Although not shown any particular example of FIG. 2, a flip chip package structure in certain embodiments may also include interposers, heat sinks, and/or other suitable components.

This example flip chip package structure can also include metal layer 6 located above pad 2, and bump 4 located above metal layer 6. In particular embodiments, the side edges of bump 4 do not make contact with isolation layer 3. Metal layer 6 can fully cover the exposed portion of pad 2. For example, metal layer 6 can substantially cover a width of the through hole formed in isolation layer 3, and may make contact with isolation layer 3 on either side of the through hole. Metal layer 6 can be used to achieve tight welding, or good electrical and mechanical connectivity, between pad 2 and bump 4. For example, metal layer 6 can be formed of any suitable metal, alloy, or conductive layer (e.g., titanium copper, titanium tungsten, copper metal, etc.). Metal layer 6 can also be used to protect remaining portions of the surface of exposed pad 2 from corrosion.

In particular embodiments, the side edges of bump 4 do not make contact with isolation layer 3. Thus, a gap can exists between the side edges of bump 4 and isolation layer 3. Various materials and/or shapes for bump 4 can be uitilized in particular embodiments. For example, bump 4 can be a cylindrical bump formed by tin, copper or gold metal, and the bottom width of bump 4 can be less than its top width. This bump shape can be configured to avoid problems related to fracture of isolation layer 3 caused by contacting, and may also improve the reliability of the package structure. Further, no additional protection layer may be uitilized for protecting isolation layer 3, reducing product costs as compared to other approaches.

Referring now to FIGS. 3A to 3E shown are cross-section diagrams of an example flip chip package structure fabrication process, in accordance with embodiments of the present invention. In one embodiment, a method of fabricating a flip chip package structure, can include: (i) forming a pad on a chip; (ii) depositing an isolation layer on the chip and the pad; (iii) forming a through hole in the isolation layer to selectively expose a portion of an upper surface of the pad; (iv) depositing a metal layer on the pad to fully cover the exposed portion of the pad; and (v) forming a bump on the metal layer, where side edges of the bump do not make contact with the isolation layer.

Figure 3A:
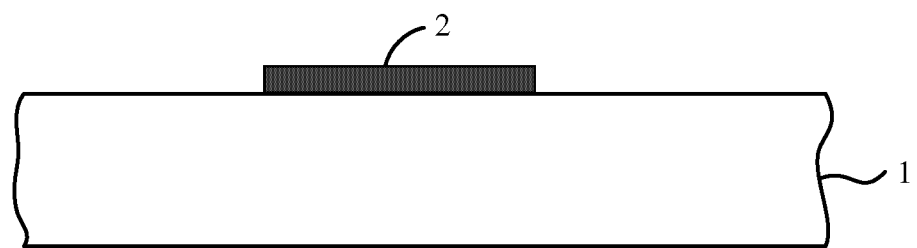
FIGS. 3A to 3E show cross-section diagrams of an example flip chip package structure fabrication process, in accordance with embodiments of the present invention.
Figure 3B:
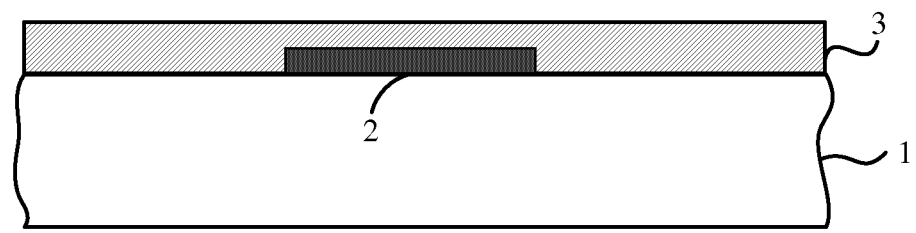

In FIG. 3A, a metal layer (e.g., aluminum, etc.) can be deposited on the active (e.g., top) surface of chip 1 to form pad 2. For example, the pad can be formed by any suitable processing step (e.g., sputtering, plating, etc.). In FIG. 3B, isolation layer 3 can be deposited above and may cover the active surface of chip 1 and pad 2, as shown. Isolation layer 3 can be a passivation layer for protecting inner circuitry of the chip.

Figure 3C:
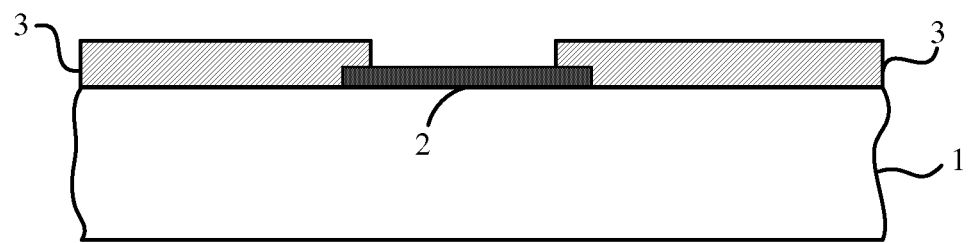
Figure 3D:
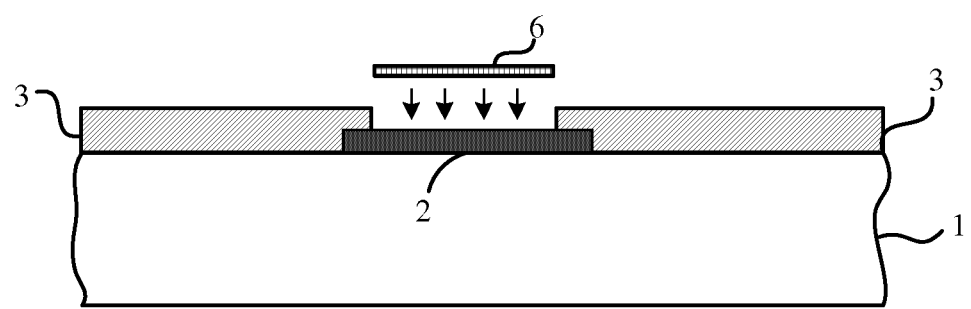

In FIG. 3C, a through hole can be formed in isolation layer 3 to selectively expose a portion of an upper surface of pad 2. Any suitable shape (e.g., circle, square, rectangle, etc.) and size of the through hole can be supported based on the particular application and shape of the bump. In FIG. 3D, metal layer 6 can be deposited on the exposed pad surface inside the through hole. For example, a layer of metal can be deposited on a top layer of the full structure, and then etched such that material to form metal layer 6 remains in the through hole. Metal layer 6 can be used to achieve electrical and mechanical connectivity between pad 2 and bump 4. For example, metal layer 6 can be formed by sputtering a titanium metal layer above the exposed pad inside the through hole, and then sputtering a copper metal layer on the titanium metal layer.

Metal layer 6 can fully cover the exposed portion of pad 2 inside the through hole. Also, metal layer 6 (e.g., titanium metal layer) and pad 2 (e.g., aluminum metal layer) can form a good junction, and metal layer 6 (e.g., upper copper metal layer) and bump 4 formed by a metal material can have a good junction, so as to improve reliability of the pad and the bump. In addition to providing good electrical and mechanical connectivity between pad 2 and bump 4, metal layer 6 can also prevent a remaining exposed surface of the pad from corrosion.

For example, metal layer 6 can be formed by sputtering a titanium metal layer above the exposed pad 2 inside the through hole, sputtering a tungsten metal layer on the titanium metal layer, and sputtering a copper metal layer on the tungsten metal layer. In this way, inner circuitry of the chip can be protected from corrosion or other potentially harmful factors. Various other structures and processes can be supported for fabricating metal layer 6, and/or other structures described herein. For example, the metal layer can include a titanium/nickel/silver (Ti/Ni/Ag) tri-metal alloy that may be formed using chemical vapor deposition (CVD), atomic layer deposition (ALD), sputtering, electro-deposition, and/or other suitable techniques. In other examples, metal layer 6 may be screen-printed, adhesively attached, and/or otherwise bonded to pad 2.

Figure 3E:
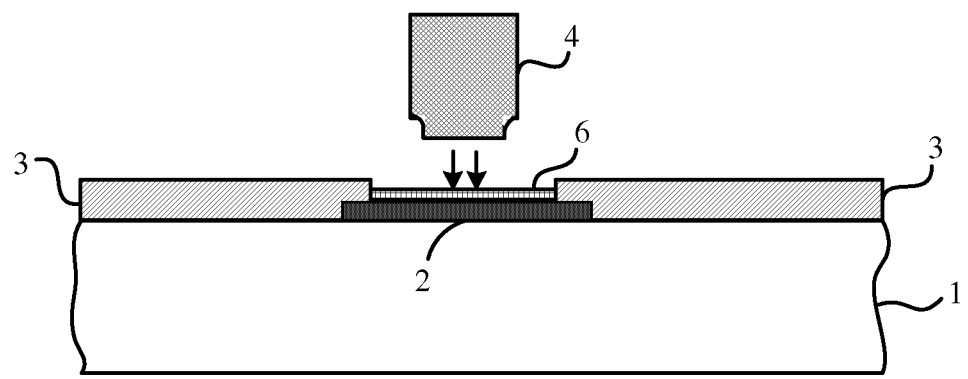

In FIG. 3E, another metal layer can be deposited above metal layer 6 to form bump 4. For example, photoresist can be coated on the pad located at the through hole. In order to make sure that the bottom of the bump can cover a portion (but not all of the exposed pad) of the surface of metal layer 6, the photoresist can be selectively exposed and developed. In this way, an electroplating groove can correspond to the surface portion of the exposed pad. Thus, the side edges of the electroplating groove may not make contact with isolation layer 3 once bump 4 is formed.

In the electroplating groove, the electroplating metal (e.g., copper metal) can form the bump with a height lower than that of the electroplating groove, and the remaining photoresist can be removed. In this example, the bump can be any suitable material (e.g., tin, copper, gold, etc.), and the cross-sectional shape of the bump can have a top portion that is wider than a base portion. The base portion of bump 4 can connect to metal layer 6 as shown.

Other sorts of electrically conductive couplers (e.g., bumps, balls, etc.) can be utilized in particular embodiments, such as those having a shape configurable so as to not make contact with isolation layer 3 while being attached to metal layer 6. For example, bump 4 can include a solder bump, a gold bump, a copper pillar bump, and/or other suitable electrically conductive coupler. As used herein, the term "solder" can generally refer to a fusible metal alloy with a melting point in the range of from about 90° C. to about 450° C. Examples of a solder include alloys of at least some of copper, tin, lead, silver, zinc, and/or other suitable metals.

It can be seen from the above-described flip chip package structure and fabrication process, the metal layer can achieve tight welding or electrical/mechanical connectivity between the pad and the bump. In addition, the metal layer can protect the exposed pad metal layer portion that is not mechanically connected or welded with the bump. In this way, the exposed pad can be protected from corrosion that might otherwise affect chip performance.

Various types of integrated circuits can be formed in chip 1, and may have external connections via bump 4. Chip 1 can include any suitable type of integrated circuit device. For example, chip 1 can include one or more of metal-oxide-semiconductor field-effect transistors (MOSFETs), junction gate field-effect transistors (JFETs), laterally diffused MOS (LDMOS) transistors, insulated gate bipolar transistors, capacitors, and/or other suitable electrical components. In other examples, chip 1 can include other suitable types of electrical and/or mechanical components.

Figure 4:
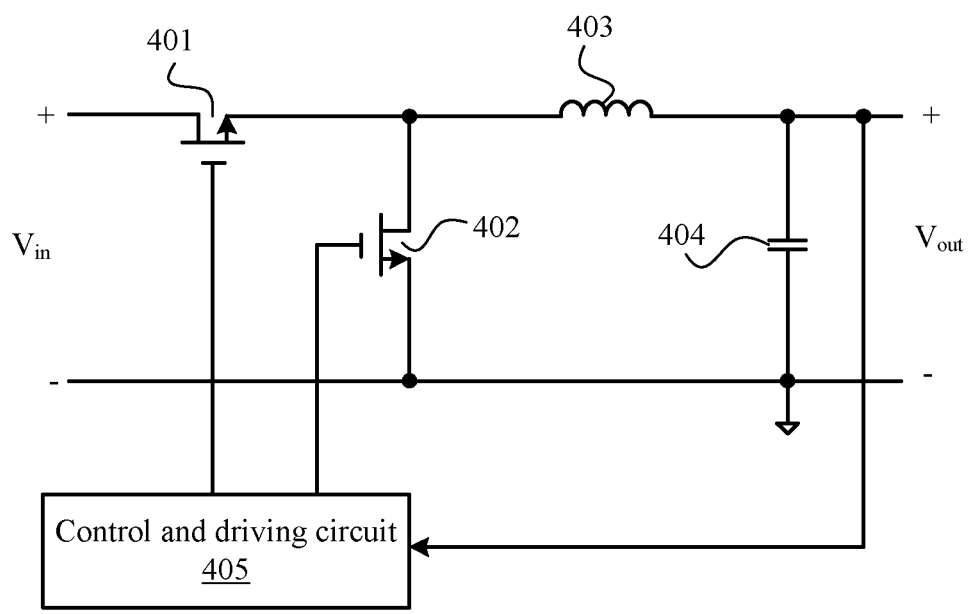
FIG. 4 is a schematic diagram of an example synchronous switching voltage regulator suitable for use in accordance with embodiments of the present invention.

Referring now to FIG. 4, shown is a schematic diagram of an example switching voltage regulator that may represent just one example of circuitry formed within chip 1. In this example, power transistor 401, power transistor 402, inductor 403, and capacitor 404 can form a synchronous buck power stage circuit. In other cases, other types of power stage or converter circuits (e.g., flyback, SEPIC, boost, buck-boost, etc.) can be formed. Control and driving circuit 405 (e.g., including a pulse-width modulation [PWM] controller) can receive an output signal of the power stage circuit, to form a closed-loop feedback control loop to control the switching state of power transistors 401 and 402. In this way, the output signal of the power stage circuit can be controlled to be substantially constant.

The packaging structure as described herein, as well as multiple chip packaging structures, can be employed for this type of power circuitry. For example, power transistors 401 and 402 can be integrated into a single chip, and control and driving circuit 405 can be integrated into another chip, and then the two chips can be encapsulated essentially in parallel in the packaging structure.

Of course, other integration or grouping of circuitry into different chips or ICs can be accommodated in particular embodiments. In one example, a multi-chip packaging structure in particular embodiments can include power transistor 401 and power transistor 402 being integrated into a power device chip, and control and driving circuit 405 being integrated into a control chip. The power device chip can be placed directly on the printed-circuit board (PCB) or lead frame, such that the area of the power device chip can be as close to the area of the chip carrier as possible. Since the power device may process a high voltage and/or a high current, the power device chip with a large area can be able to withstand a relatively high voltage and a relatively high current. Also, the power device may have better thermal characteristics for power supply integration.

For the integrated circuit of the switching voltage regulator shown in FIG. 4, if the carrying capacity of power transistor 402 is greater than that of power transistor 401, power transistor 402 may be much larger than power transistor 401. Thus, power transistor 402 (e.g., the synchronous power device) can be integrated in a single synchronous power device chip, and power transistor 401 (e.g., the main power device) as well as control and driving circuit 405 can be integrated in another single mixed chip. The synchronous power device chip can be placed on a lead frame or PCB.

Figure 5:
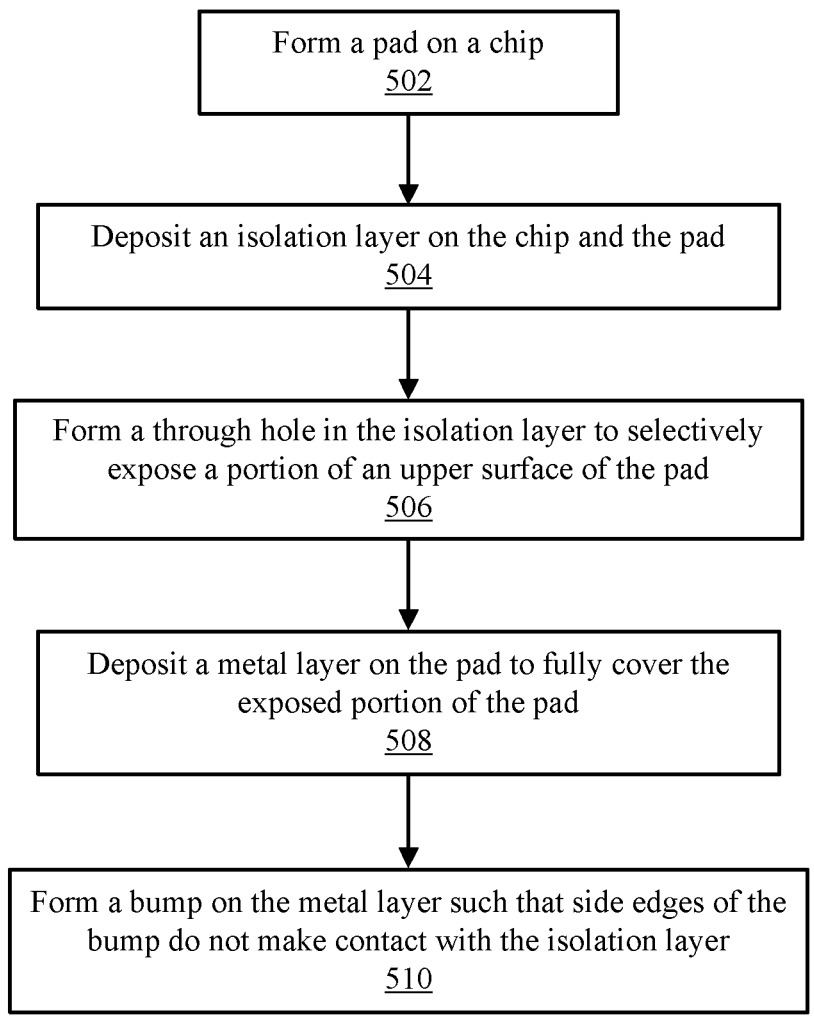
FIG. 5 is a flow diagram of an example method of fabricating a flip chip package structure, in accordance with embodiments of the present invention.

Referring now to FIG. 5, shown is a flow diagram of an example method of fabricating a flip chip package structure, in accordance with embodiments of the present invention. At 502, a pad can be formed on a chip (see, e.g., FIG. 3A). At 504, an isolation layer can be deposited on the chip and the pad (see, e.g., FIG. 3B). At 506, a through hole can be formed in the isolation layer to selectively expose a portion of an upper surface of the pad (see, e.g., FIG. 3C). At 508, a metal layer can be deposited on the pad to fully cover the exposed portion of the pad (see, e.g., FIG. 3D). At 510, a bump can be formed on the metal layer. For example, the side edges of the bump may not make contact with the isolation layer (see, e.g., FIG. 3E).

In particular embodiments the side edges of the bump may not contact with the isolation layer such that potential fracture problems of the passivation layer caused by contacting between the bump and the passivation layer can be substantially or fully avoided. In this way, the reliability of the package structure can be improved, and no additional protection for the isolation layer may be utilized or needed, thus reducing package structure costs. In addition, the metal layer utilized in particular embodiments can achieve tight welding between the pad and the bump, as well as provide corrosion protection for the pad.

The above describes various example flip chip package structures and fabrication processes. Those skilled in the art will recognize that other techniques, structures, circuit layout, and/or components can also or alternatively be applied or uitilized in particular embodiments. The embodiments were chosen and described in order to best explain the principles of the invention and its practical applications, to thereby enable others skilled in the art to best utilize the invention and various embodiments with modifications as are suited to the particular use contemplated. It is intended that the scope of the invention be defined by the claims appended hereto and their equivalents.

What is claimed is:

1. A flip chip package structure, comprising:
   a) a pad on a die;
   b) an isolation layer on said die and said pad, wherein said isolation layer comprises a through hole that exposes a portion of said pad;
   c) a metal layer on said pad, wherein said metal layer fully covers said exposed portion of said pad, and wherein said metal layer is fully contained within said through hole; and
   d) a bump on said metal layer, wherein said bump is separated from said isolation layer by gaps, wherein said bump comprises a top portion that is wider than a bottom portion, and wherein said bottom portion is the only portion of said bump that is in contact with said metal layer.

2. The flip chip package structure of claim 1, wherein said isolation layer comprises a passivation layer.

3. The flip chip package structure of claim 1, wherein said metal layer comprises a first type metal layer to protect said pad from corrosion.

4. The flip chip package structure of claim 3, wherein said first type metal layer comprises a titanium metal layer.

5. The flip chip package structure of claim 3, wherein said first type metal layer comprises a tungsten metal layer.

6. The flip chip package structure of claim 3, wherein said metal layer comprises a second type metal layer for reliable electrical connection between said pad and said bump.

7. The flip chip package structure of claim 1, wherein said bump comprises at least one of: tin, copper, and gold.

8. The flip chip package structure of claim 1, wherein side edges of said metal layer are in contact with said isolation layer.

9. The flip chip package structure of claim 1, wherein the sum of heights of said metal layer and said pad is less than a height of said isolation layer.

10. The flip chip package structure of claim 6, wherein said second type metal layer comprises a copper metal layer.

11. The flip chip package structure of claim 6, wherein said first type metal layer is connected to said pad, and said second type metal layer is arranged on said first type metal layer.

12. The flip chip package structure of claim 1, wherein a bottom surface of said metal layer is fully in contact with said pad.

13. The flip chip package structure of claim 1, wherein a width of said through hole and said metal layer is greater than a width of said bump.

14. The flip chip package structure of claim 1, wherein said bump is not connected to a bond wire.

15. The flip chip package structure of claim 14, wherein said bump is connected to a lead frame.

16. The flip chip package structure of claim 1, wherein said die comprises at least one power transistor.

* * * * *